(12) United States Patent
Merte et al.

(10) Patent No.: US 9,735,041 B2
(45) Date of Patent: Aug. 15, 2017

(54) UNIVERSAL CLAMPING FIXTURE TO MAINTAIN LAMINATE FLATNESS DURING CHIP JOIN

(71) Applicant: International Business Machines Corporation, Armonk, NY (US)

(72) Inventors: Donald A. Merte, Poughkeepsie, NY (US); Thomas Weiss, Poughkeepsie, NY (US)

(73) Assignee: International Business Machines Corporation, Armonk ( * ) Notice: Subject to any disclaimer, the term of this patent is extended or adjusted under 35 U.S.C. 154(b) by 15 days.

(21) Appl. No.: 14/840,004

(22) Filed: Aug. 30, 2015

(65) Prior Publication Data

US 2015/0371888 A1 Dec. 24, 2015

Related U.S. Application Data

(62) Division of application No. 13/777,229, filed on Feb. 26, 2013.

(51) Int. Cl.
*H01L 21/687* (2006.01)
*H01L 23/00* (2006.01)
*B23Q 3/06* (2006.01)

(52) U.S. Cl.
CPC ........ *H01L 21/68721* (2013.01); *B23Q 3/061* (2013.01); *H01L 21/68728* (2013.01);
(Continued)

(58) Field of Classification Search
None
See application file for complete search history.

(56) References Cited

U.S. PATENT DOCUMENTS 4,624,057 A 11/1986 Hursey
4,878,409 A 11/1989 Carithers, Jr.
(Continued)

OTHER PUBLICATIONS

Jadhav et al. Flip Chip Assembly Challenges Using High Density, Thin Core Carriers; Electronic Components and Technology Conference, IEEE 2005; pp. 314-319.
(Continued)

*Primary Examiner* — Joseph J Hail
*Assistant Examiner* — Brian Keller
(74) *Attorney, Agent, or Firm* — Steven J. Meyers; Howard M. Cohn; Daniel M. Cohn

(57) ABSTRACT

A clamping apparatus and method for maintaining a workpiece flatness during processing includes a base having a planar surface for receiving a first workpiece. Two sets of opposing clamping mechanisms are mounted to the base and include a clamp head at a distal end of a rod extending from a housing in removable overlapping relation to the first workpiece. Each set of the clamp heads are in opposing spaced relationship to each other defining a second workpiece area, and the clamp heads are configured to mate with a top surface of the first workpiece. A biasing member is coupled to each of the housings and apply a downward vertical force to the housings, rods, and the clamp heads for applying a downward vertical pressure to the first workpiece. The first workpiece is thereby discouraged from thermally expanding in a vertical direction and is thermally expandable horizontally along the planar surface.

1 Claim, 5 Drawing Sheets

(52) U.S. Cl.
CPC ........ *H01L 21/68778* (2013.01); *H01L 24/75* (2013.01); *H01L 2224/75704* (2013.01); *Y10T 29/49826* (2015.01); *Y10T 29/49842* (2015.01); *Y10T 29/49998* (2015.01); *Y10T 29/50* (2015.01)

(56) References Cited

U.S. PATENT DOCUMENTS

| | | |
|---|---|---|
| 5,729,896 A | 3/1998 | Dalal et al. |
| 5,785,307 A * | 7/1998 | Chung ............... H05K 13/0069 269/254 CS |
| 5,820,013 A | 10/1998 | Ortiz |
| 5,868,887 A | 2/1999 | Sylvester et al. |
| 6,011,697 A | 1/2000 | Budnaitis et al. |
| 6,020,221 A | 2/2000 | Lim et al. |
| 6,490,161 B1 | 12/2002 | Johnson |
| 7,375,032 B2 | 5/2008 | Seliger et al. |
| 7,985,621 B2 | 7/2011 | Chan et al. |
| 2009/0001140 A1 * | 1/2009 | Katayama ............ B23K 1/0016 228/212 |
| 2011/0215463 A1 | 9/2011 | Lin et al. |
| 2013/0323345 A1 | 12/2013 | Blackshear et al. |

OTHER PUBLICATIONS

Larmouth et al.; Reliability of micro-BGA-on-Flex Assemblies; 8 pgs. total; Teledyne Electronic Technologies, 110 Lowel Rd., Hudson NH 03051.

* cited by examiner

UNIVERSAL CLAMPING FIXTURE TO MAINTAIN LAMINATE FLATNESS DURING CHIP JOIN

CROSS REFERENCE TO RELATED APPLICATIONS

This application is a division of commonly-owned, copending U.S. patent application Ser. No. 13/777,229 entitled UNIVERSAL CLAMPING FIXTURE TO MAINTAIN LAMINATE FLATNESS DURING CHIP JOIN, and filed on Feb. 26, 2013.

FIELD

The present disclosure relates to a clamping apparatus and method for clamping a workpiece during processing, and more particularly, a clamping apparatus and method for clamping a workpiece during processing which connects the workpiece to another workpiece on a laminate.

BACKGROUND

Fabrication of organic flip chip electronic modules typically includes a chip join reflow on a laminate, such as a thin-laminate organic circuit board, for example, a printed wiring board (PWB) or printed circuit board (PCB). During fabrication of an organic flip chip electronic module, particularly those modules using thin core and coreless organic laminates, it is important that the laminate remain as flat as possible in the chip site area during a chip join reflow. Failure to keep the laminate flat can result in undesirable solder bridging (that is, shorts), as well as chip interconnect opens. Undesirable die stresses can also result from variations in the laminate shape during reflow. Undesirable laminate warpage can also occur during processing of a chip/die and a laminate, for example, during flip chip fabrication which can present itself in a variety of shapes and each shape can affect the process in a different way. Die stresses can manifest themselves as a cracked die, or separations of the dielectric layers within the die (e.g., typically, white bumps). Increased laminate warpage (also referred to as warping) during die reflow can also lead to increased module warpage at the end of a bond and assembly process, which can cause the module to fail final co-planarity specifications. Laminates can have varying shapes depending on their location within the panel prior to dicing, which can lead to varying results after chip join reflow if there are no provisions to compensate for the laminate warpage.

Laminate warpage or warping may be defined by the laminate's curvature from a flat surface of the bottom of the laminate. Alternatively, laminate warpage may be defined by a planar surface mating with the bottom of the laminate, thereby providing a horizontal plane to reference any warping of the laminate.

Previous attempt to alleviate the problem of laminate warpage during processing, for example, during flip chip electronic module processing, includes using: A) Copper balancing methods in the substrate design, which have the disadvantage of placing constraints on the design of the package that may preclude the product from meeting electrical performance requirements; B) Permanent stiffeners that are attached to the laminate around the perimeter, which have the disadvantage of being expensive, permanent, and have limited success in keeping the chipsite area flat; C) Temporary stiffeners also have the disadvantage of being expensive and difficult to remove, and can interfere with the standard manufacturing process; and D) Fixtures that rigidly constrain the laminate and have the disadvantage of not allowing for thermal expansions have limited effectiveness and interfere with standard processes.

It would therefore be desirable to provide an apparatus and method for constraining a laminate particularly along a vertical axis, while allowing for movement along a horizontal plane due to thermal expansion. It is further desirable to maintain a flat chip site area through a reflow processing step with minimal impact on the process, including cost and processing time to the manufacturing line.

BRIEF SUMMARY

In an aspect of the invention a clamping apparatus for maintaining a workpiece flatness during processing includes a base having a planar surface for receiving a first workpiece. Two sets of opposing clamping mechanisms are mounted to the base and each of the clamping mechanisms include a clamp head at a distal end of a rod extending from a housing in removable overlapping relation to the first workpiece. Each set of the clamp heads are in opposing spaced relationship to each other defining a second workpiece area for a second workpiece, and the clamp heads are configured to mate with a top surface of the first workpiece. A biasing member is coupled to each of the housings. The biasing members communicate with the rods via the housings and applying a downward vertical force to the housings and rods and therethrough the clamp heads for applying a downward vertical pressure to the first workpiece such that the first workpiece is discouraged to thermally expand in a vertical direction with respect to a horizontal plane defined by the planar surface and is thermally expandable along the horizontal plane.

In another aspect of the invention, a method of manufacturing a clamping apparatus for maintaining a workpiece flatness during processing includes: mounting two sets of opposing clamping mechanisms on a base and each clamping mechanism including a clamp head at a distal end of a rod extending from a housing in removably overlapping relation to a first workpiece, each set of the clamp heads being in opposing spaced relationship to each other defining a second workpiece area for a second workpiece, and the clamp heads being configured to mate with a top surface of the first workpiece; and coupling a biasing member to each of the housings, the biasing members communicating with the rods via the housings and applying a downward vertical force to the housings and rods and therethrough the clamp heads for applying a downward vertical pressure to the first workpiece such that the first workpiece is discouraged to thermally expand in a vertical direction with respect to a horizontal plane defined by the planar surface and is thermally expandable along the horizontal plane.

In another aspect of the invention, a method for maintaining a workpiece flatness during processing includes: receiving a first workpiece on a base having a planar surface; positioning a second workpiece between two sets of opposing clamping mechanisms mounted to the base and each clamping mechanism including a clamp head at a distal end of a rod extending from a housing in removable overlapping relation to the first workpiece, each set of the clamp heads being in opposing spaced relationship to each other defining a second workpiece area for receiving the second workpiece, and the clamp heads being configured to mate with a top surface of the first workpiece; and applying a downward vertical pressure to the first workpiece using a biasing member coupled to each of the housings, the biasing members communicating with the rods via the housings and applying a downward vertical force to the housings and rods and therethrough the clamp heads such that the first workpiece is discouraged to thermally expand in a vertical direction with respect to a horizontal plane defined by the planar surface and is thermally expandable along the horizontal plane.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
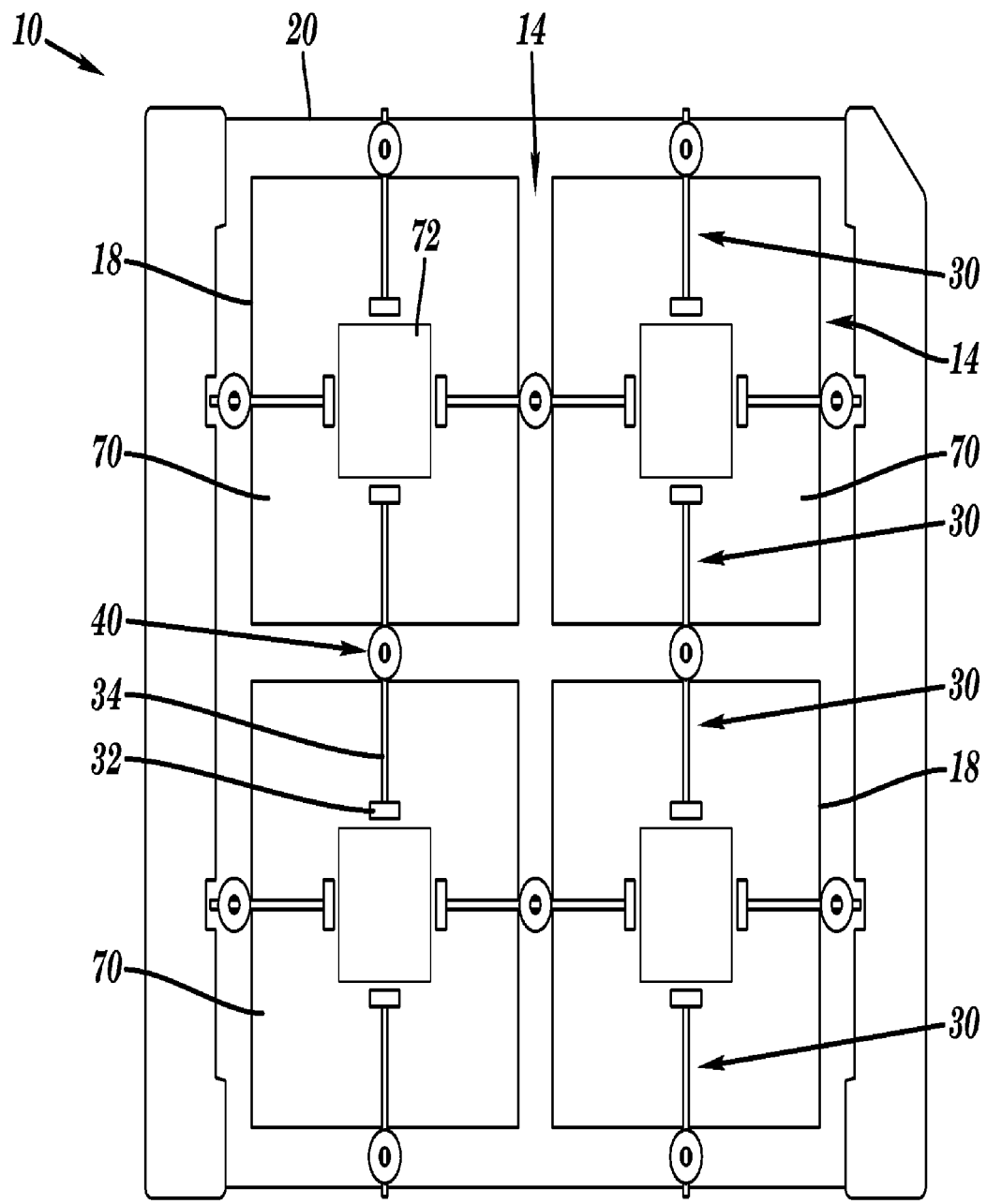
FIG. 1 is an isometric view of a clamping fixture including clamping mechanisms in an engaged position on a base having a frame, according to according to an embodiment of the disclosure.
Figure 2:
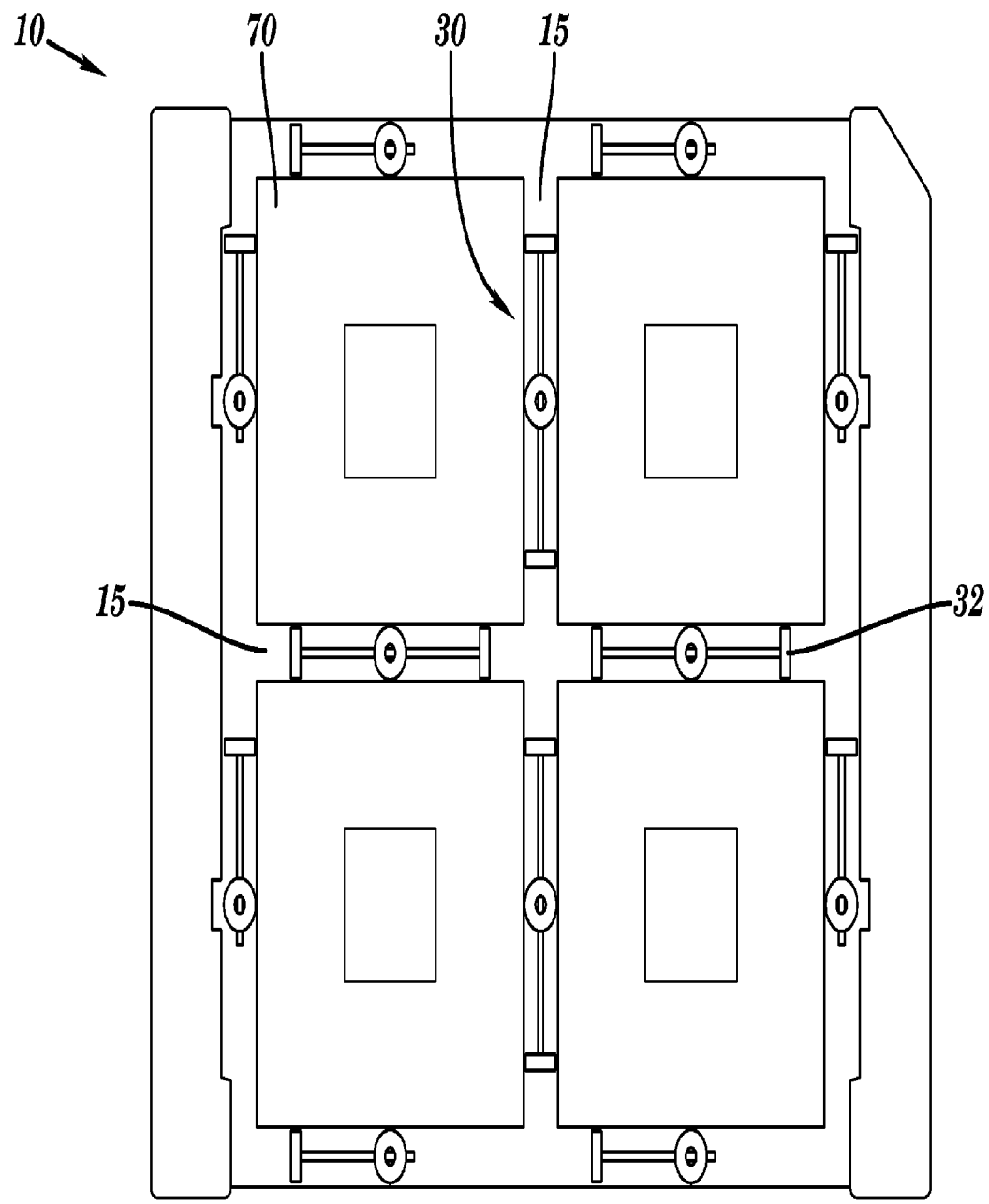
FIG. 2 is an isometric view of the clamping fixture shown in FIG. 1 having the clamping mechanism in a non-engaged position.
Figure 3:
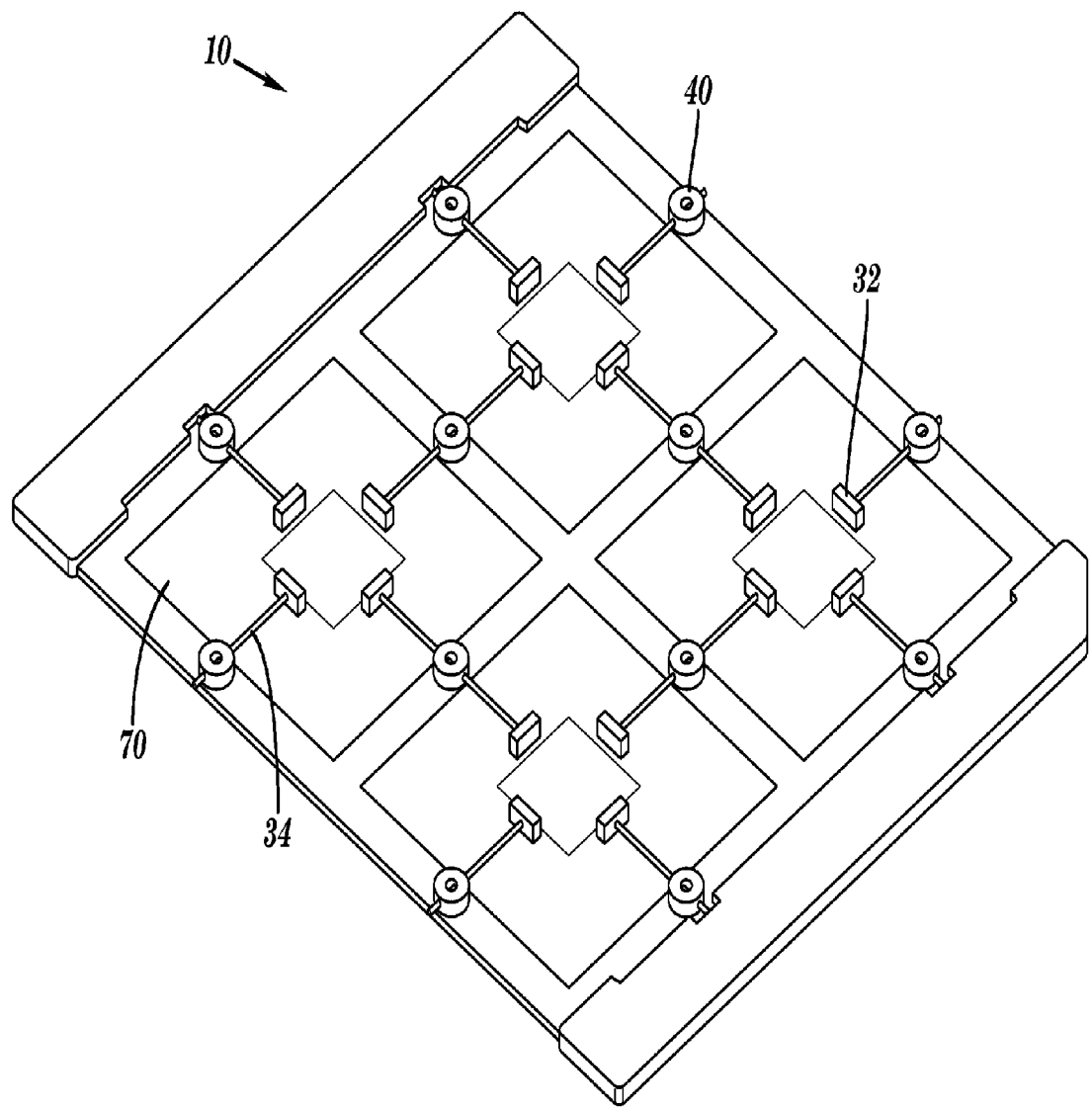
FIG. 3 is a side elevational view of the clamping fixture shown in FIG. 1.
Figure 4:
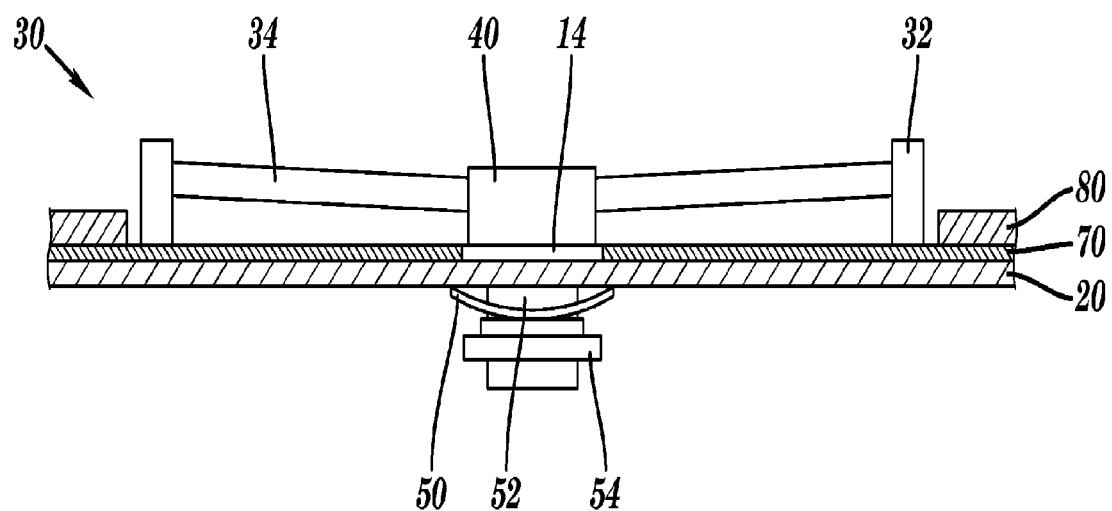
FIG. 4 is a detail side elevational view of the clamping mechanism and the base shown in FIGS. 1 and 3.

Referring to FIGS. 1 and 2, a clamping fixture 10 includes a frame 14 over a base 20 (also shown in FIG. 4). The frame 14 divides the fixture into four work areas 18 and is used to locate the first workpieces in a X,Y direction. Alternatively, the frame can be divided into another number of work areas depending on the overall size of the fixture and the size of the workpieces. The frame may be comprise, for example, stainless steel. The clamping fixture 10 is an embodiment of a clamping apparatus may be used in a corresponding method according to an embodiment of the invention. The base 20 includes a planar surface configured to receive a first workpiece embodied as a laminate 70. For example, the frame 14 may have work areas 55 mm long to accommodate 55 mm laminates. Two sets of opposing clamping mechanisms 30 are mounted through the frame 14 and to the base 20. The frame may be about 0.5 mm thick, and is positioned on the base to locate the laminates 70. Each clamping mechanism 30 includes a clamp head 32 at a distal end of a rod embodied as spring wire 34 extending from a housing 40. The spring wire may be comprised of, for example, 304 grade stainless steel. Alternatively, the spring wire may be comprised of 316 stainless steel, or 17-7 stainless steel. For example, in higher temperature applications (processing greater than 290° C.), austenitic nickel-chromium-based superalloys (for example, Inconel™) can be used as an alternative to stainless steel. In an example, the clamping mechanism via the spring wire may apply a force to the laminate in the range of about, 0.1 lbs to 2 lbs per clamping head. A range of compliance of the clamping heads may be, for example, between about 0.010" to 0.050".

The housings 40 are mounted through the frame 14 and to the base 20 as shown in FIG. 1, which includes four housings on the interior of the frame which have opposing spring wires 34 and clamp heads 32 in opposing relation to each other to extend over two work areas 18. The spring wire may be hardened to a specified hardness. The spring wire 34 may be attached to the housing at an attachment junction or junction point. The clamp head 32 is in overlapping relation to the laminate 70.

Each set of the clamp heads 32 for a work area 18 are in opposing spaced relationship to each other defining a second workpiece area 72 for a second workpiece embodied as a die 80. The die 80 is positioned over the laminate 70, as shown in FIG. 4. The opposing clamp heads 32 may define the second workpiece area 72 with specified dimensions which can be adjusted for different sized workpieces. The clamp heads 32 are configured to mate with the top surface of the laminate 70. The clamp heads 32 may be positioned at various locations around a second workpiece (or around the second workpiece area 72), in the present disclosure, the die 80, to provide the vertical downward force to the laminate thereby maintaining flatness of the laminate within the die area (i.e., the second workpiece area 72) during a chip join to the laminate. The location of the clamp heads 32 may be just outside a chip edge where capacitors may be absent. Because of the vertical force of the clamp heads 32 on the laminate, the laminate 70 is free to move in a horizontal direction in a plane parallel to the planar surface of the base 20 as the laminate experiences thermal expansion, and the laminate does not expand out of the horizontal plane in the vertical direction.

Referring to FIG. 4, a biasing member embodied as a spring washer 50 is coupled to each of the housings 40. The spring washer 50 communicates with the spring wires 34 via the housings 40 and apply a downward vertical force to the housings 40 and the spring wires 34 and therethrough the clamp heads 32 for applying a downward vertical pressure to the laminate 70. The spring washer 50 is affixed to a bottom side of the base 20 using a fastener 54 beneath the spring washer 50. The fastener 54 is fastened to a shaft 52 which extends through the base 20 and is integral with the housing 40 on a top side of the base 20.

Referring to FIG. 2, the clamping mechanisms 30 are rotatably connected through the frame 14 and connected to the base 20, and rotate in a horizontal plane defined by the planar surface of the base 20 to a non-engaged position, as shown in FIG. 2, freeing the clamp heads 32 from overlapping the laminate 70. Thus, the clamping heads 32 are rotatable to be positioned along axes defined by each leg 15 of the frame 14. The spring wires 34 and clamp heads 32 are rotatable to an engaged position (as shown in FIG. 1) with each set of the clamp heads 32 in opposing spaced relationship to each other overlapping the laminate 70 for the clamp heads 32 to provide the downward vertical pressure to the laminate 70.

Figure 5:
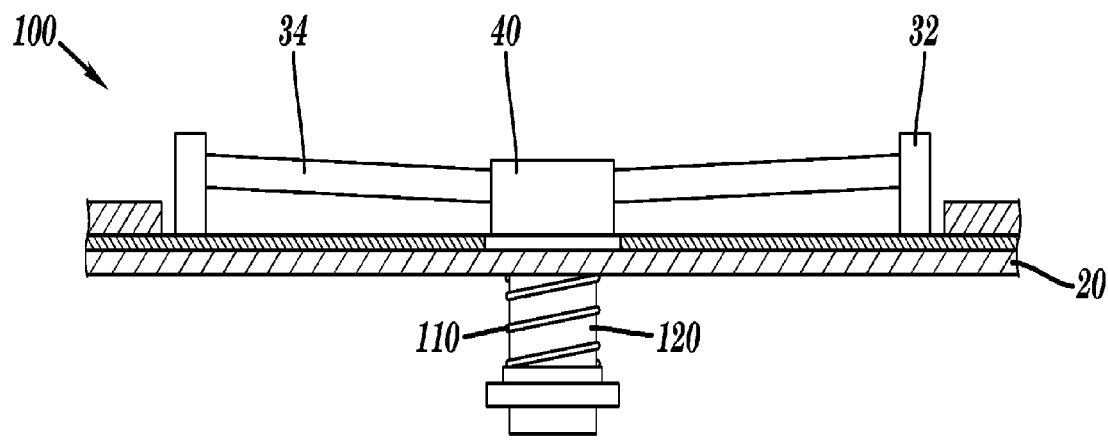
FIG. 5 is a detail side elevation view of an alternative embodiment of a clamping mechanism having a spring loaded element in an expanded state and having a housing of the clamping mechanism in a rest state.
Figure 6:
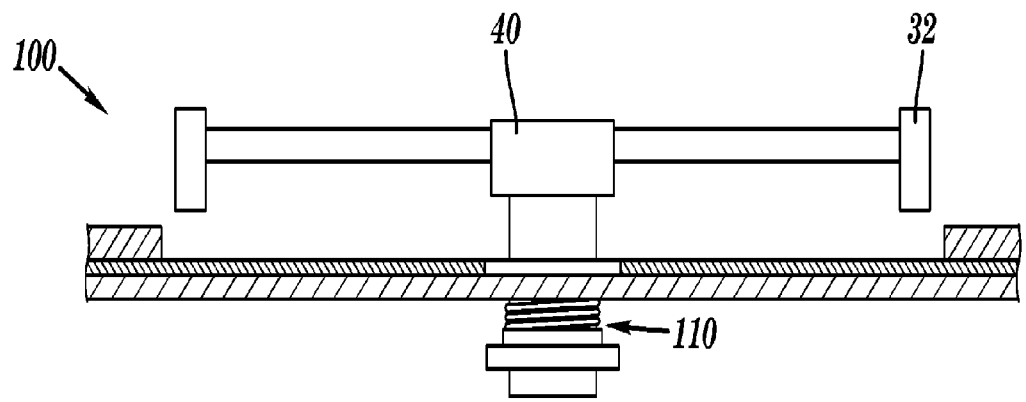
FIG. 6 is a detail side elevational view of the clamping mechanism shown in FIG. 5 having the spring loaded element in a compressed state and the housing in an elevated position.

Referring to FIGS. 5-6, an alternative clamping mechanism 100 is vertically moveable and includes similar elements as the clamping mechanism 30 shown in FIGS. 1-4 which elements have the same reference numerals. The moveable clamping mechanism 100 includes a spring loaded element embodied as a spring 110 wrapped around a moveable shaft 120. The spring 110 has a specified stiffness to exert a downward force on the housing 40 and thereby the clamping heads 32, similar to the clamping mechanism 30. However, the spring 110 has a higher compliance to allow the spring 110 to be compressed as shown in FIG. 6. When the spring 110 is in a compressed state as shown in FIG. 6, the housing, via the extension of the shaft through the base 20, is elevated off of the base 20. The clamping heads 32 are likewise elevated off of the laminate 70 in a disengaged position. When the spring 110 is in an expanded state, as shown in FIG. 5, the housing 40 rests on the base 20 and likewise the clamping heads 32 rest on the laminate 70 in an engaged position. The movement of the housing as described above can be initiated automatically using a tool which may include electrical impulses to activate the spring, housing, shaft interaction for the housing to be elevated off and onto the base 20. For example, an automated tool (not shown) may consist of a mechanism that engages the bottom of the shaft 52, moving it in the vertical direction. Thus, the tool can activate the spring, and the shaft can be rotated, once the spring is compressed and the clamping heads 32 are no longer resting on the laminate 70.

Referring to FIGS. 1-6, a method according to an embodiment of the invention for maintaining a workpeice flatness during processing includes receiving the first workpiece, i.e., the lamination 70 on the planar surface of the base 20. The second workpiece, i.e., the die 80 is positioned between the two sets of clamp heads 32 of the opposing clamping mechanisms 30, as shown in FIG. 4 and is shown logically in relation to the second workpiece area 72 shown in FIG. 1 defined by the clamp heads 32. The clamp heads 32 are configured to mate with the top surface of the laminate 70. The spring washer 50 applies downward force to the housing and thereby the spring wires 34 and the clamp heads 32 on the laminate 70. The downward vertical force to the laminate 70 results in the laminate maintaining flatness during processing of the laminate 70 and the die 80.

In the embodiment of the disclosure, the laminate 70 may be placed in the clamping fixture 10 prior to applying flux to connect the laminate to the die 80. The laminate may remain in the fixture 10 through a chip join reflow process. The fixture 10 is configured to permit almost full access to the top surface of the laminate so that, for example, capacitors can be placed and reflowed at the same time as the chip.

In the present embodiment of the disclosure shown in FIGS. 1 and 2, the clamping fixture 10 uses the rotating clamping mechanisms 30 that can be rotated out of the way for loading/unloading of the laminate 70, and then rotated back for engagement of the clamp heads 32. Advantages of the rotating clamping mechanisms include ease of use, and discouraging damage/debris generation as the clamp 32 is rotated into an engagement position over the laminate.

The ability of the clamping mechanism 30 to apply force, that is, the downward vertical force of the clamp head 32 on the laminate 70, can be specified or adjusted by adjusting the diameter of the spring wire, the length of the spring wire, as well as the material of the spring wire, and can be optimized for the particular application. Additionally, the fixture of the present disclosure can be re-configured for different laminate sizes, different die sizes, and different laminate constructions. The present disclosure constrains the laminate along a vertical axis, while allowing for movement in the horizontal axis due to thermal expansion. This allows for maintaining a flat chip site area, through reflow, with minimal impact (e.g., cost and process) to the manufacturing line.

One advantage to the present disclosure is that the fixture 10 can be configured for any shape laminate, or laminate construction (coreless, thin-core, etc.), while the fixture maintains a high chip join yield by improving the laminate flatness. Further, the fixture of the present disclosure may allow a greater tolerance of a flatness specification on incoming laminates, which improves the laminate provider's yield, and thus can reduce costs.

Thereby, as disclosed above, the embodiments of the invention provide a temporary apparatus and method of maintaining laminate flatness (particularly in the chipsite area), during a chip join process so as to ensure desirable chip join yields. As the present disclosure enables nearly full access to the top surface of the laminate, discrete components (capacitors, etc.) can be placed and reflowed at the same time as the chip to provide a solder connection. The present disclosure also has the advantage of allowing for easy implementation of the clamping fixture in a multi workspace configuration (as shown in FIGS. 1-2) to increase manufacturing efficiency.

While embodiments of the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for maintaining a workpiece flatness during processing, comprising:
   receiving a first workpiece on a base having a planar surface;
   positioning a second workpiece between two clamping mechanisms mounted to the base and each clamping mechanism including a clamp head at a distal end of a rod extending from a housing configured to be in overlapping relation to the first workpiece, wherein the second workpiece comprises a die, each of the clamp heads extending below the rod, and being in spaced relationship to each other defining a second workpiece area for receiving the second workpiece, and the clamp heads being configured to mate with a top surface of the first workpiece and wherein each clamp head is located along an edge of the die; and
   applying a downward vertical pressure to the first workpiece using a biasing member including a spring washer coupled to each of the housings, the biasing member communicating with the rods via the housings wherein the downward vertical pressure is transmitted only by the clamp heads via the housings and rods such that the first workpiece is discouraged to thermally expand in a vertical direction with respect to a horizontal plane defined by the planar surface and is thermally expandable along the horizontal plane.

* * * * *